(12) United States Patent
Abiko

(10) Patent No.: US 11,328,776 B2
(45) Date of Patent: May 10, 2022

(54) SEMICONDUCTOR MEMORY DEVICE

(71) Applicant: KIOXIA CORPORATION, Tokyo (JP)

(72) Inventor: Naofumi Abiko, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 149 days.

(21) Appl. No.: 16/784,161

(22) Filed: Feb. 6, 2020

(65) Prior Publication Data

US 2021/0090655 A1 Mar. 25, 2021

(30) Foreign Application Priority Data

Sep. 19, 2019 (JP) .............................. JP2019-170558

(51) Int. Cl.

| | |
|---|---|
| *H01L 27/11565* | (2017.01) |
| *G11C 16/04* | (2006.01) |
| *H01L 27/11556* | (2017.01) |
| *H01L 23/528* | (2006.01) |
| *H01L 27/11526* | (2017.01) |
| *H01L 27/11573* | (2017.01) |
| *G11C 16/26* | (2006.01) |
| *H01L 27/11519* | (2017.01) |
| *H01L 27/11582* | (2017.01) |
| *G11C 16/24* | (2006.01) |

(52) U.S. Cl.
CPC .......... *G11C 16/0483* (2013.01); *G11C 16/24* (2013.01); *G11C 16/26* (2013.01); *H01L 23/528* (2013.01); *H01L 27/11519* (2013.01); *H01L 27/11526* (2013.01); *H01L 27/11556* (2013.01); *H01L 27/11565* (2013.01); *H01L 27/11573* (2013.01); *H01L 27/11582* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 2015/0262630 A1 | 9/2015 | Shirakawa et al. | |
| 2018/0286488 A1 | 10/2018 | Sanasi et al. | |
| 2020/0126622 A1* | 4/2020 | Utsumi | ............. H01L 27/11573 |
| 2021/0066223 A1* | 3/2021 | Tsai | ........................ H01L 24/50 |

FOREIGN PATENT DOCUMENTS

JP 2015176309 A 10/2015

* cited by examiner

*Primary Examiner* — Christopher A Johnson
(74) *Attorney, Agent, or Firm* — Kim & Stewart LLP

(57) ABSTRACT

A semiconductor memory device includes first and second memory blocks arranged along a first direction, a first bit line extending in the first direction and including first and second portions respectively through which the first and second memory blocks are connected to the first bit line, a first sense amplifier connected to the first bit line, a first wiring which extends in a second direction intersecting the first direction, and overlaps the second portion of the first bit line when viewed in a third direction intersecting the first and second directions, and a controller which applies a first voltage to the first bit line, and a second voltage to the first wiring during a read operation. A first distance between the first sense amplifier and the first portion is shorter than a second distance between the first sense amplifier and the second portion.

20 Claims, 11 Drawing Sheets

SEMICONDUCTOR MEMORY DEVICE

CROSS-REFERENCE TO RELATED APPLICATION

This application is based upon and claims the benefit of priority from Japanese Patent Application No. 2019-170558, filed Sep. 19, 2019, the entire contents of which are incorporated herein by reference.

FIELD

Embodiments described herein relate generally to a semiconductor memory device.

BACKGROUND

A semiconductor memory device including a plurality of memory blocks arranged along a first direction and a plurality of bit lines extending in the first direction and arranged along a second direction intersecting the first direction is known.

DETAILED DESCRIPTION

Figure 1:
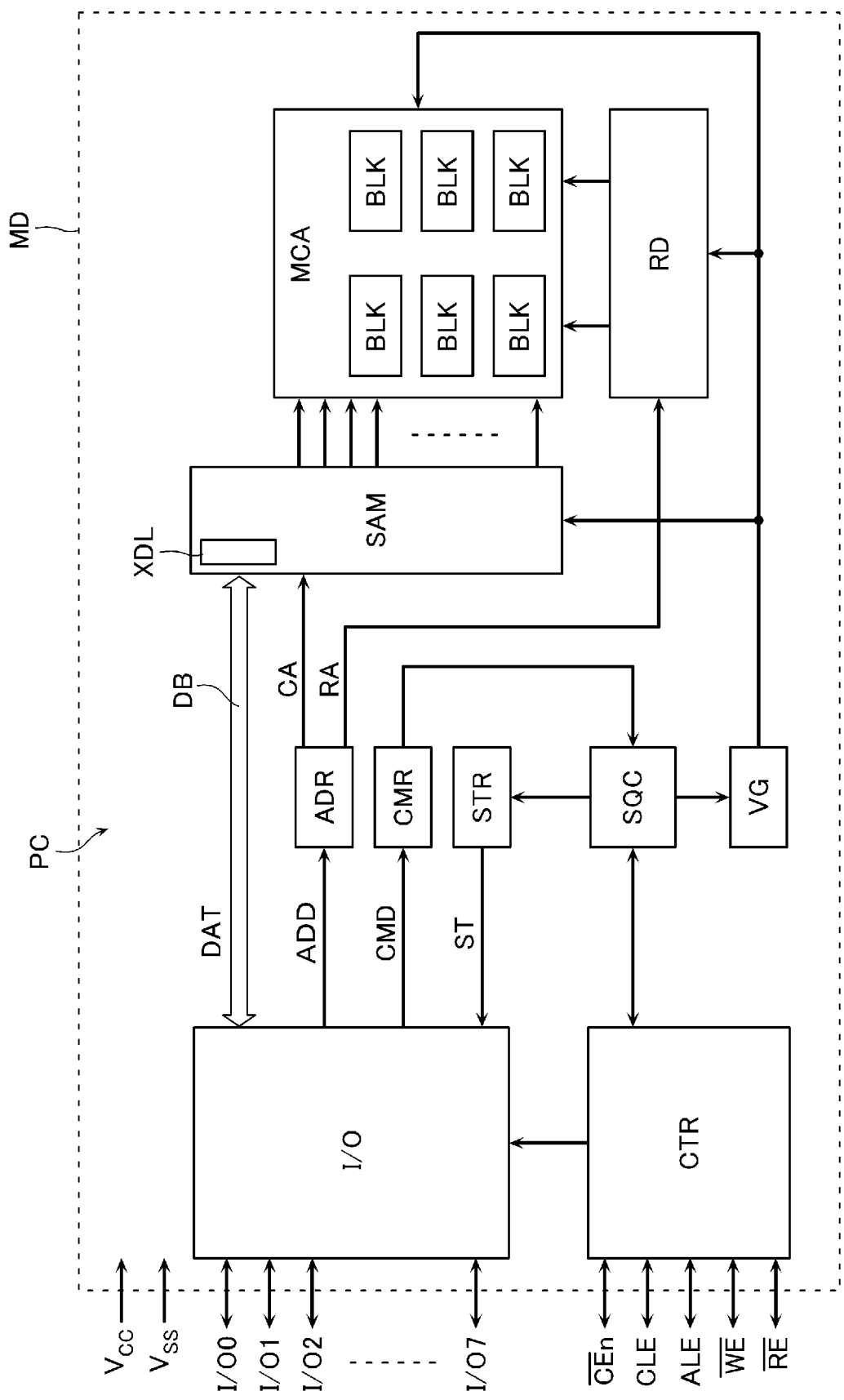
FIG. 1 is a schematic block diagram illustrating a configuration example of a semiconductor memory device according to a first embodiment.

Embodiments provide a semiconductor memory device capable of operating at high speed.

In general, according to one embodiment, there is provided a semiconductor memory device including a semiconductor memory device that includes first and second memory blocks arranged along a first direction, a first bit line extending in the first direction and including a first portion through which the first memory block is connected to the first bit line and a second portion through which the second memory block is connected to the first bit line, a first sense amplifier connected to the first bit line, a first wiring which extends in a second direction intersecting the first direction, and overlaps the second portion of the first bit line when viewed in a third direction intersecting the first direction and the second direction, and a controller which applies a first voltage to the first bit line, and a second voltage to the first wiring during a read operation. A first distance between the first sense amplifier and the first portion is shorter than a second distance between the first sense amplifier and the second portion.

Next, a semiconductor memory device according to embodiments will be described in detail with reference to the accompanying drawings. The following embodiments are merely examples, and are not intended to limit the present disclosure.

In this specification, a predetermined direction parallel to an upper surface of a semiconductor substrate is referred to as the X-direction, a direction parallel to the upper surface of the semiconductor substrate and perpendicular to the X-direction is referred to as the Y-direction, and a direction perpendicular to the upper surface of the semiconductor substrate is referred to as the Z-direction.

In this specification, a direction along a predetermined plane may be referred to as a first direction, a direction intersecting the first direction along the predetermined plane is a second direction, and a direction intersecting the predetermined plane may be referred to as a third direction. The first direction, the second direction, and the third direction may or may not correspond to any of the X-direction, the Y-direction, and the Z-direction.

In this specification, expressions such as "upper" and "lower" are based on a semiconductor substrate. For example, a direction away from the semiconductor substrate along the Z-direction is referred to as "upper", and a direction approaching the semiconductor substrate along the Z-direction is referred to as "lower". When referring to a lower surface or lower end portion of a certain configuration, it means a surface or end portion on the semiconductor substrate side of this configuration, and when referring to an upper surface or upper end portion, it means a surface or end portion on a side opposite to the semiconductor substrate side of this configuration. A surface intersecting the X-direction or the Y-direction is referred to as a side surface and the like.

In this specification, when a first configuration is described to be "electrically connected" to a second configuration, the first configuration is directly connected to the second configuration, or alternatively, the first configuration is connected to the second configuration via a wiring, a semiconductor member, a transistor, or the like. For example, when three transistors are connected in series, a first transistor is "electrically connected" to a third transistor even if a second transistor is in an OFF state.

In this specification, when a first configuration is described to be "connected between" a second configuration and a third configuration, it means that the first configuration, the second configuration, and the third configuration are connected in series, and the first configuration is provided in a current path of the second configuration and the third configuration.

In this specification, when a circuit or the like is described to "conduct" two wirings or the like, for example, it means that the circuit or the like includes a transistor or the like, and the transistor or the like is provided in a current path between two wirings, the transistor or the like enters an ON state.

First Embodiment

The configuration of a semiconductor memory device according to a first embodiment will be described below with reference to the drawings. The following drawings are schematic and a part of the configuration may be omitted for convenience of explanation.

Figure 2:
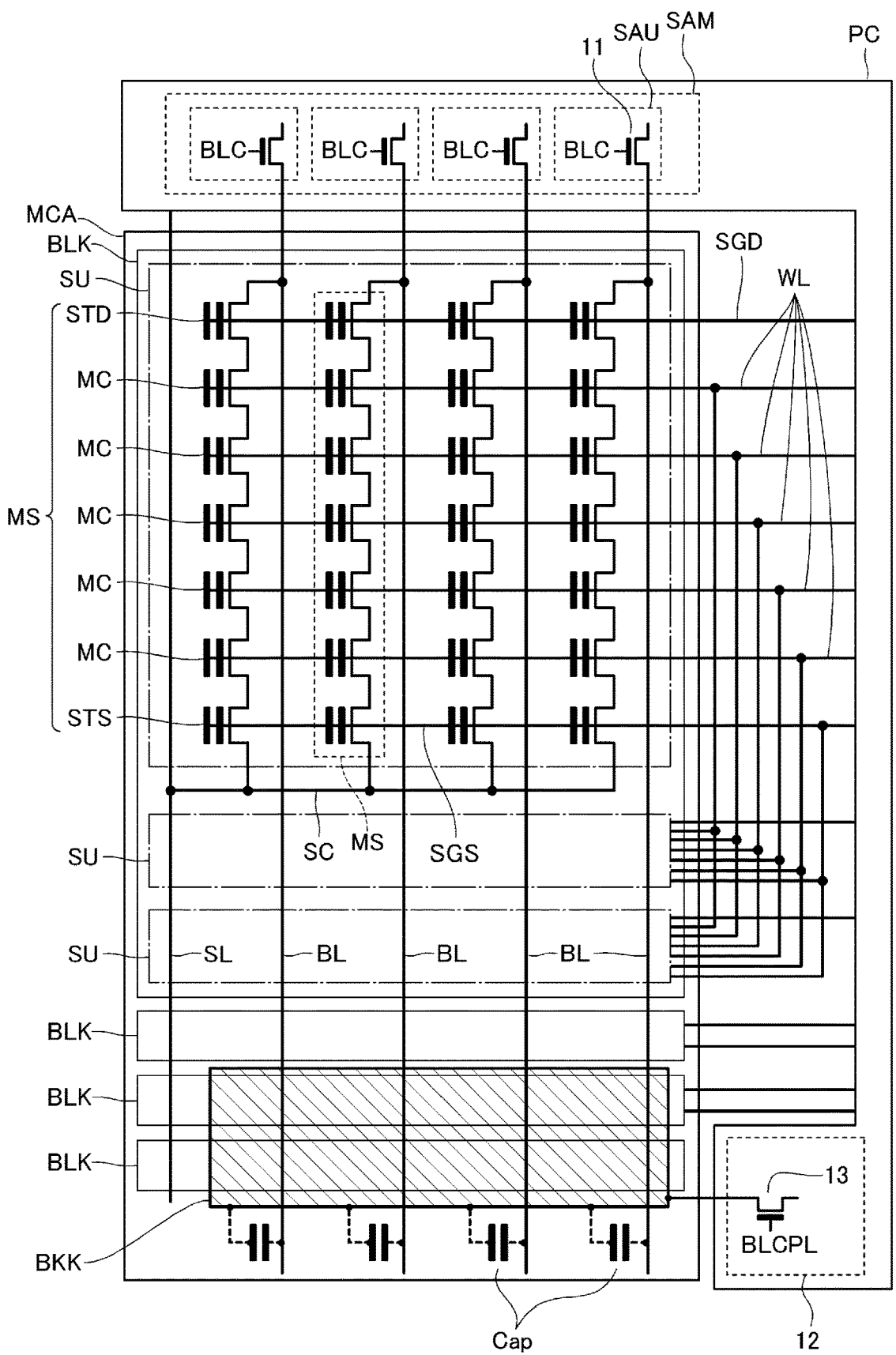
FIG. 2 is a schematic circuit diagram illustrating the same configuration example as FIG. 1.

FIG. 1 is a schematic block diagram illustrating a configuration example of the semiconductor memory device according to this embodiment. FIG. 2 is a schematic circuit diagram illustrating a configuration example of the semiconductor memory device according to this embodiment.

The semiconductor memory device according to this embodiment includes a memory die MD as illustrated in FIG. 1, for example. The memory die MD includes a memory cell array MCA that stores data, and a peripheral circuit PC connected to the memory cell array MCA.

Circuit Configuration of Memory Cell Array MCA The memory cell array MCA includes a plurality of memory blocks BLK as illustrated in FIG. 2.

Each of the plurality of memory blocks BLK includes a plurality of string units SU. Each of the plurality of string units SU includes a plurality of memory strings MS. One ends of the plurality of memory strings MS are connected to the peripheral circuit PC via bit lines BL, respectively. The other ends of the plurality of memory strings MS are connected to the peripheral circuit PC via a common lower wiring SC and source line SL, respectively.

The memory string MS includes a drain select transistor STD, a plurality of memory cells MC, and a source select transistor STS connected in series between the bit line BL and the source line SL. Hereinafter, the drain select transistor STD and the source select transistor STS may be simply referred to as select transistors (STD and STS).

The memory cell MC is a field effect transistor including a semiconductor layer functioning as a channel region, a gate insulating film including a charge storage film, and a gate electrode. A threshold voltage of the memory cell MC changes according to an amount of charges stored in the charge storage film. The memory cell MC stores 1-bit or multi-bit data. Each of word lines WL is connected to each of the gate electrodes of the plurality of memory cells MC corresponding to one memory string MS. Each of the word lines WL is commonly connected to all the memory strings MS in one memory block BLK.

The select transistors (STD and STS) are field effect transistors including a semiconductor layer functioning as a channel region, a gate insulating film, and a gate electrode. Select gate lines (SGD and SGS) are connected to the gate electrodes of the select transistors (STD and STS), respectively. The drain selection line SGD is provided corresponding to the string unit SU, and is commonly connected to all the memory strings MS in one string unit SU. The source selection line SGS is commonly connected to all the memory strings MS in one memory block BLK.

FIG. 2 shows a bit line-kick line BKK facing an upper surface of a partial region of the plurality of bit lines BL. The bit line-kick line BKK faces the upper surface of the partial region of all the bit lines BL in the memory cell array MCA. The bit line-kick line BKK and the plurality of bit lines BL form a plurality of capacitors Cap. That is, a part of the bit lines BL functions as one electrode of the capacitors Cap, respectively. The bit line-kick line BKK functions as the other electrodes of the plurality of capacitors Cap.

Circuit Configuration of Peripheral Circuit PC As illustrated in FIG. 1, the peripheral circuit PC includes a row decoder RD, a sense amplifier module SAM, a kick line driver 12 (FIG. 2), a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

The row decoder RD includes, for example, a decode circuit and a switch circuit. The decode circuit decodes a row address RA latched in the address register ADR. The switch circuit makes the word line WL and the select gate lines (SGD and SGS) corresponding to the row address RA conductive with a corresponding voltage supply line according to an output signal of the decode circuit.

Figure 3:
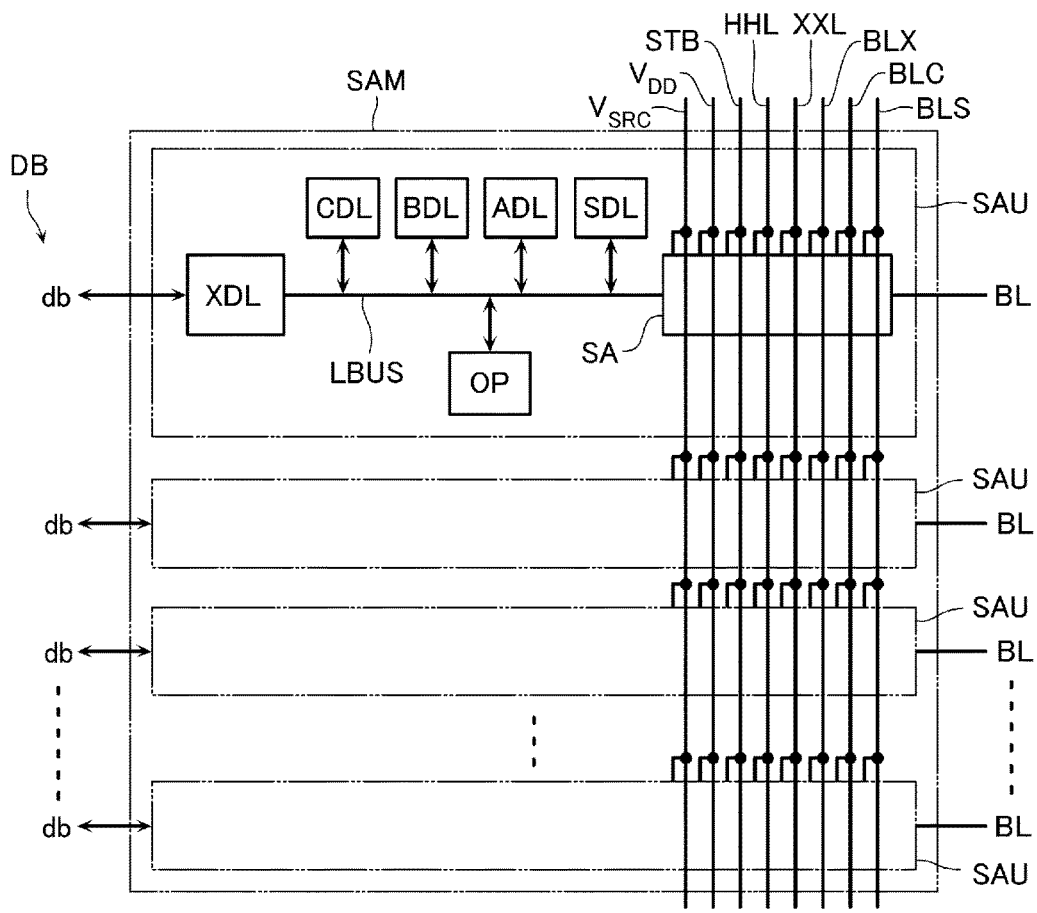
FIG. 3 is a schematic circuit diagram illustrating the same configuration example as FIG. 1.

As illustrated in FIG. 3, the sense amplifier module SAM includes a plurality of sense amplifier units SAU corresponding to the plurality of bit lines BL. The sense amplifier unit SAU includes a sense amplifier SA connected to the bit line BL, data latches SDL, ADL, BDL, CDL, and XDL, a logic circuit OP, and a wiring LBUS connected to these elements.

Figure 4:
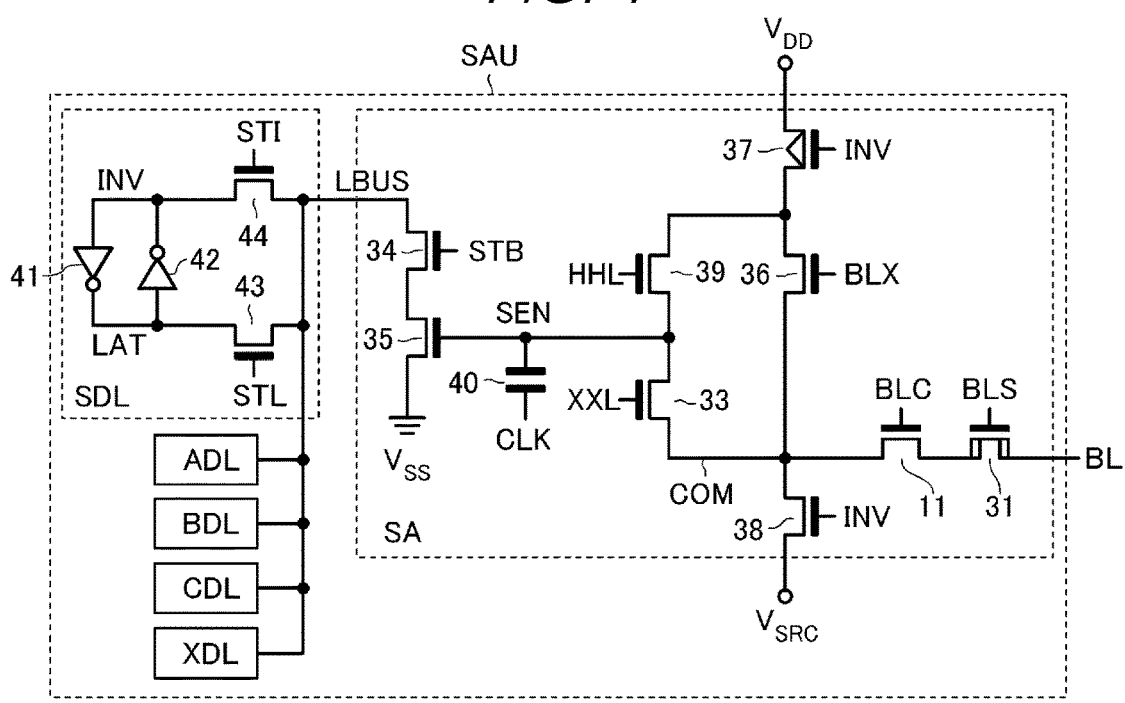
FIG. 4 is a schematic circuit diagram illustrating the same configuration example as FIG. 1.

As illustrated in FIG. 4, the sense amplifier SA includes a breakdown voltage transistor 31, a clamp transistor 11, a node COM, and a discharging transistor 33 connected in series between the bit line BL and a sense node SEN. The sense amplifier SA includes a switch transistor 34 and a sense transistor 35 connected in series between the wiring LBUS and a ground voltage supply line VSS.

The breakdown voltage transistor 31 is an NMOS breakdown voltage transistor. For example, the breakdown voltage transistor 31 protects the sense amplifier SA when a relatively large voltage is supplied to the source line SL (FIG. 2). A control signal from the sequencer SQC is supplied to the gate electrode of the breakdown voltage transistor 31 via a signal line BLS.

The clamp transistor 11 is an NMOS transistor. The clamp transistor 11 controls a voltage of the bit line BL. A control signal from the sequencer SQC is supplied to the gate electrode of the clamp transistor 11 via a signal line BLC.

Anode COM is connected to a voltage supply line VDD via a charging transistor 36 and a charging transistor 37. The node COM is connected to a voltage supply line VSRC via a discharging transistor 38. The charging transistor 36 and the discharging transistor 38 are NMOS transistors. The charging transistor 37 is a PMOS transistor. A control signal from the sequencer SQC is supplied to the gate electrode of the charging transistor 36 via a signal line BLX. The gate electrodes of the charging transistor 37 and the discharging transistor 38 are connected to anode INV of the data latch SDL, respectively.

The discharging transistor 33 is an NMOS transistor. The discharging transistor 33 discharges charges of the sense node SEN during a read operation or the like. A control signal from the sequencer SQC is supplied to the gate electrode of the discharging transistor 33 via a signal line XXL.

The sense node SEN is connected to the voltage supply line VDD via a charging transistor 39 and the charging transistor 37. The sense node SEN is connected to a signal line CLK via a capacitor 40. A control signal is supplied to the signal line CLK from the sequencer SQC. The charging transistor 39 is an NMOS transistor. A control signal from the sequencer SQC is supplied to the gate electrode of the charging transistor 39 via a signal line HHL.

The switch transistor 34 is an NMOS transistor. The switch transistor 34 makes the wiring LBUS and the sense transistor 35 conductive during the read operation or the like. A control signal from the sequencer SQC is supplied to the gate electrode of the switch transistor 34 via a signal line STB.

The sense transistor 35 is an NMOS transistor. The sense transistor 35 releases or maintains charges in the wiring LBUS according to the voltage of the sense node SEN. The gate electrode of the sense transistor 35 is connected to the sense node SEN.

As illustrated in FIG. 3, in this embodiment, the signal lines BLS, BLC, BLX, XXL, HHL, and STB described above are connected in common between all the sense amplifier units SAU in the sense amplifier module SAM. In this embodiment, the voltage supply lines VDD and VSRC described above are connected in common across all the sense amplifier units SAU in the sense amplifier module SAM.

As illustrated in FIG. 4, the data latch SDL includes a node LAT and a node INV, inverters 41 and 42 connected in parallel between the node LAT and the node INV, a switch transistor 43 connected between the node LAT and the wiring LBUS, a switch transistor 44 connected between the node INV and the wiring LBUS. An output terminal of the inverter 41 and an input terminal of the inverter 42 are connected to the node LAT. The input terminal of the inverter 41 and the output terminal of the inverter 42 are connected to the node INV. Although not illustrated, the data latches ADL, BDL, CDL, and XDL have the same configuration as the data latch SDL.

For example, data latched in the data latch SDL is appropriately transferred to the data latches ADL, BDL, and CDL. A logic circuit OP (FIG. 3) performs logical operations such as AND, OR, and XOR on data in the data latches ADL, BDL, and CDL, and calculates data recorded in the memory cell MC.

The data latch XDL is connected to the wiring LBUS and a wiring db constituting a bus DB (FIG. 3). In the data latch XDL, for example, data written to the memory cell MC or data read from the memory cell MC is stored.

The sense amplifier module SAM includes a decode circuit and a switch circuit (not illustrated). The decode circuit decodes a column address CA latched in an address register ADR (FIG. 1). The switch circuit makes the data latch XDL corresponding to the column address CA conductive with the bus DB according to the output signal of the decode circuit.

As illustrated in FIG. 2, the kick line driver 12 includes a switch transistor 13 connected between the bit line-kick line BKK and a voltage supply line (not illustrated). A control signal from the sequencer SQC is supplied to the gate electrode of the switch transistor 13 through a signal line BLCPL. The configuration of the kick line driver 12 may be changed as appropriate.

A voltage generation circuit VG (FIG. 1) includes, for example, a step-up circuit such as a charge pump circuit connected to the power supply voltage supply line VCC and the ground voltage supply line VSS, a step-down circuit such as a regulator, and a plurality of voltage supply lines (not illustrated). In accordance with an internal control signal from the sequencer SQC, the voltage generation circuit VG generates a plurality of operation voltages to be supplied to the bit line BL, the source line SL, the word line WL, the select gate lines (SGD and SGS), and the bit line-kick line BKK in a read operation, write operation, and erase operation with respect to the memory cell array MCA, and simultaneously outputs the plurality of operation voltages from the plurality of voltage supply lines.

The sequencer SQC (FIG. 1) sequentially decodes command data CMD latched in the command register CMR, outputs the command data CMD from a plurality of signal lines, and outputs the internal control signals to the row decoder RD, the sense amplifier module SAM, the kick line driver 12, and the voltage generation circuit VG. The sequencer SQC appropriately outputs status data indicating its own state to the status register STR. For example, when the write operation or the erase operation is executed, information indicating whether or not the write operation or the erase operation is normally completed is output as the status data.

The input/output control circuit I/O (FIG. 1) includes data input/output terminals I/O0 to I/O7, shift registers connected to the data input/output terminals I/O0 to I/O7, and FIFO buffers connected to the shift registers. In accordance with the internal control signal from the logic circuit CTR, the input/output control circuit I/O outputs the data that has been input to the data input/output terminals I/O0 to I/O7 to the data latch XDL, address register ADR, or command register CMR in the sense amplifier module SAM. The input/output control circuit I/O also outputs data that has been input from the data latch XDL or the status register STR to the data input/output terminals I/O0 to I/O7.

The logic circuit CTR (FIG. 1) receives an external control signal from an external controller via external control terminals /CEn, CLE, ALE, /WE, and /RE, and in response to the external control signal, the logic circuit CTR outputs the internal control signal to the input/output control circuit I/O.

Memory Die MD

Figure 5:
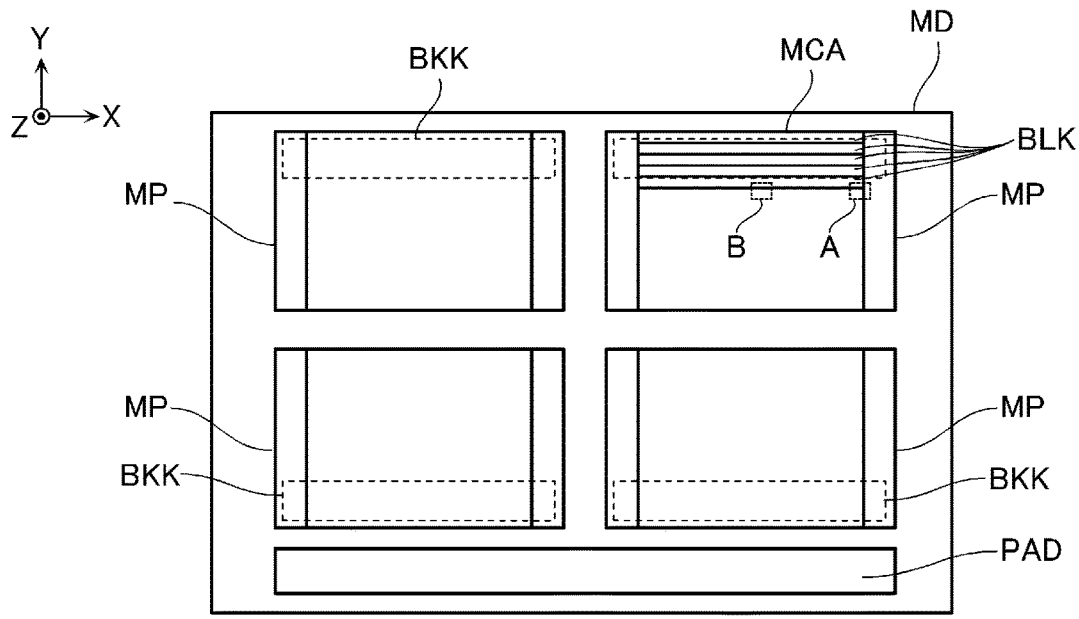
FIG. 5 is a schematic plan view illustrating the same configuration example as FIG. 1.
Figure 6:
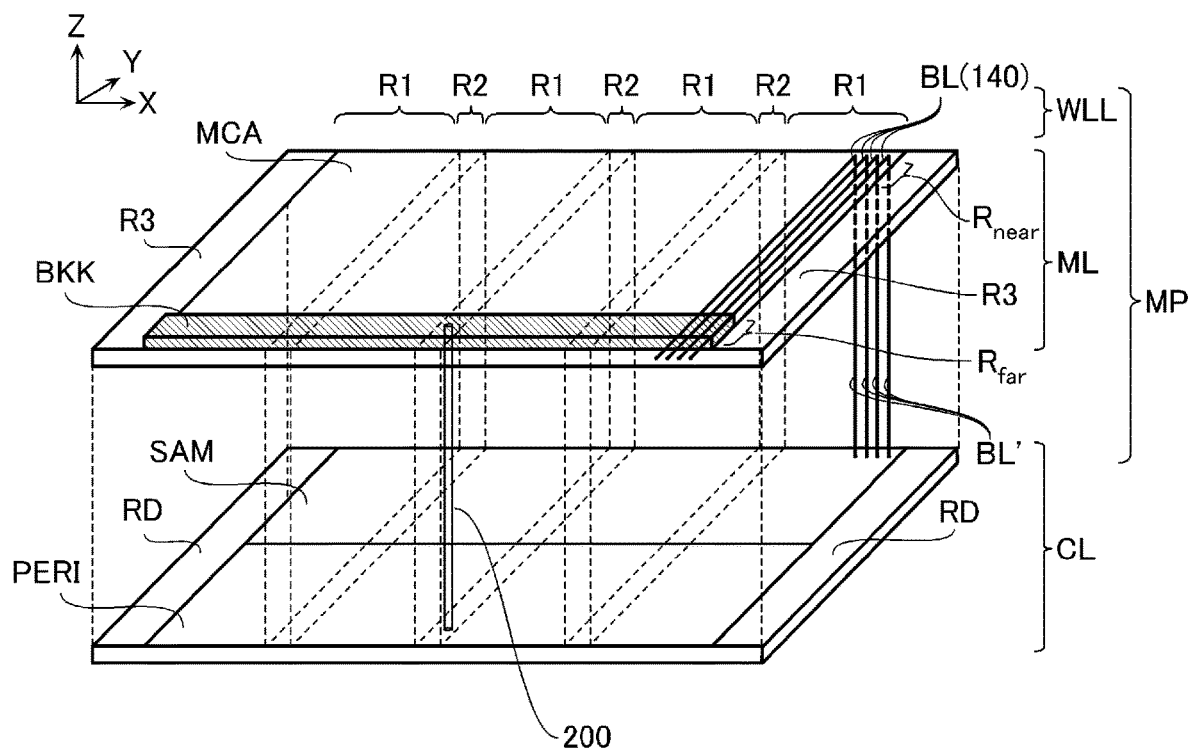
FIG. 6 is a schematic perspective view illustrating the same configuration example as FIG. 1.
Figure 7:
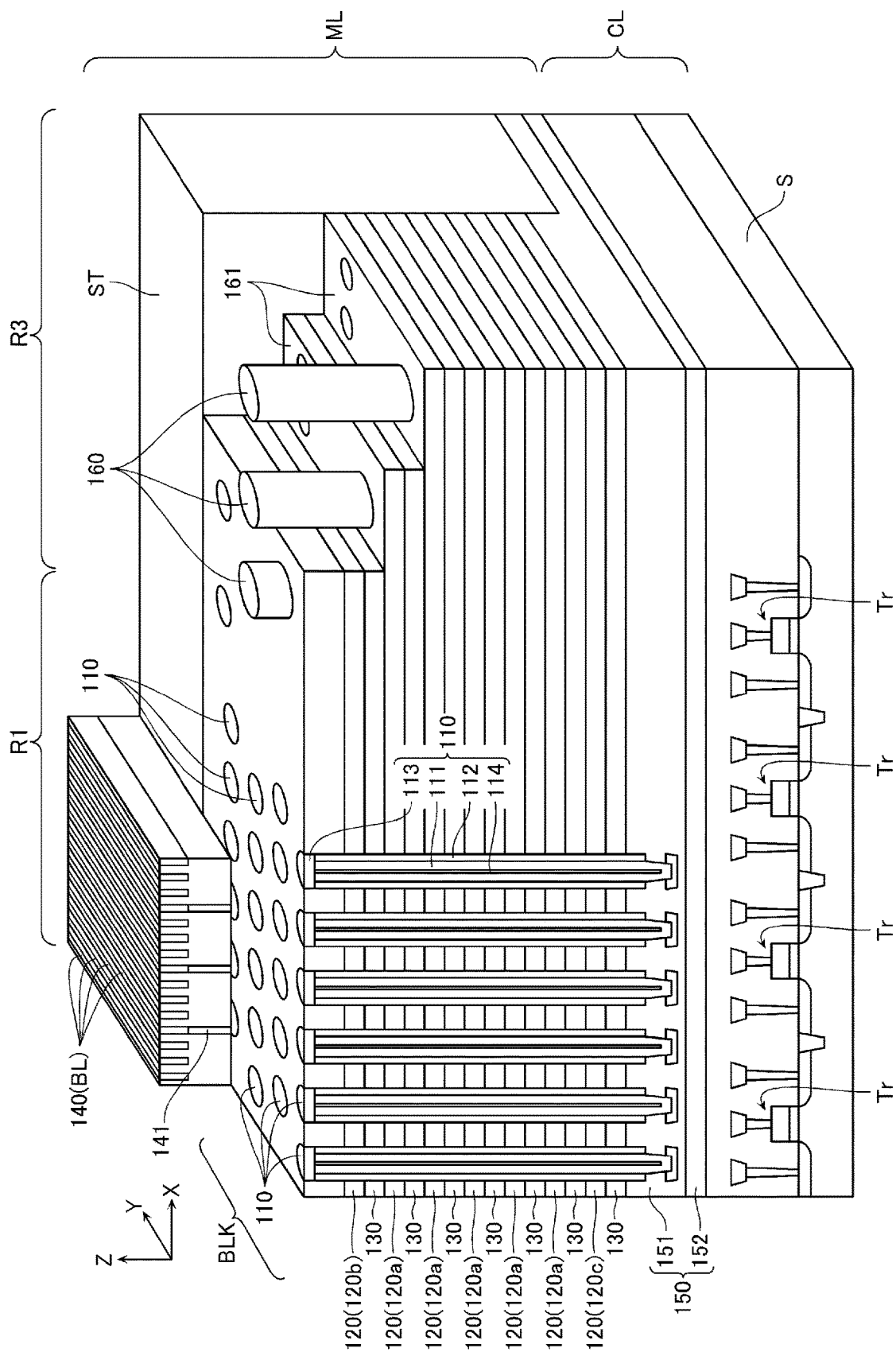
FIG. 7 is a schematic perspective view corresponding to a portion indicated by A in FIG. 5.
Figure 8:
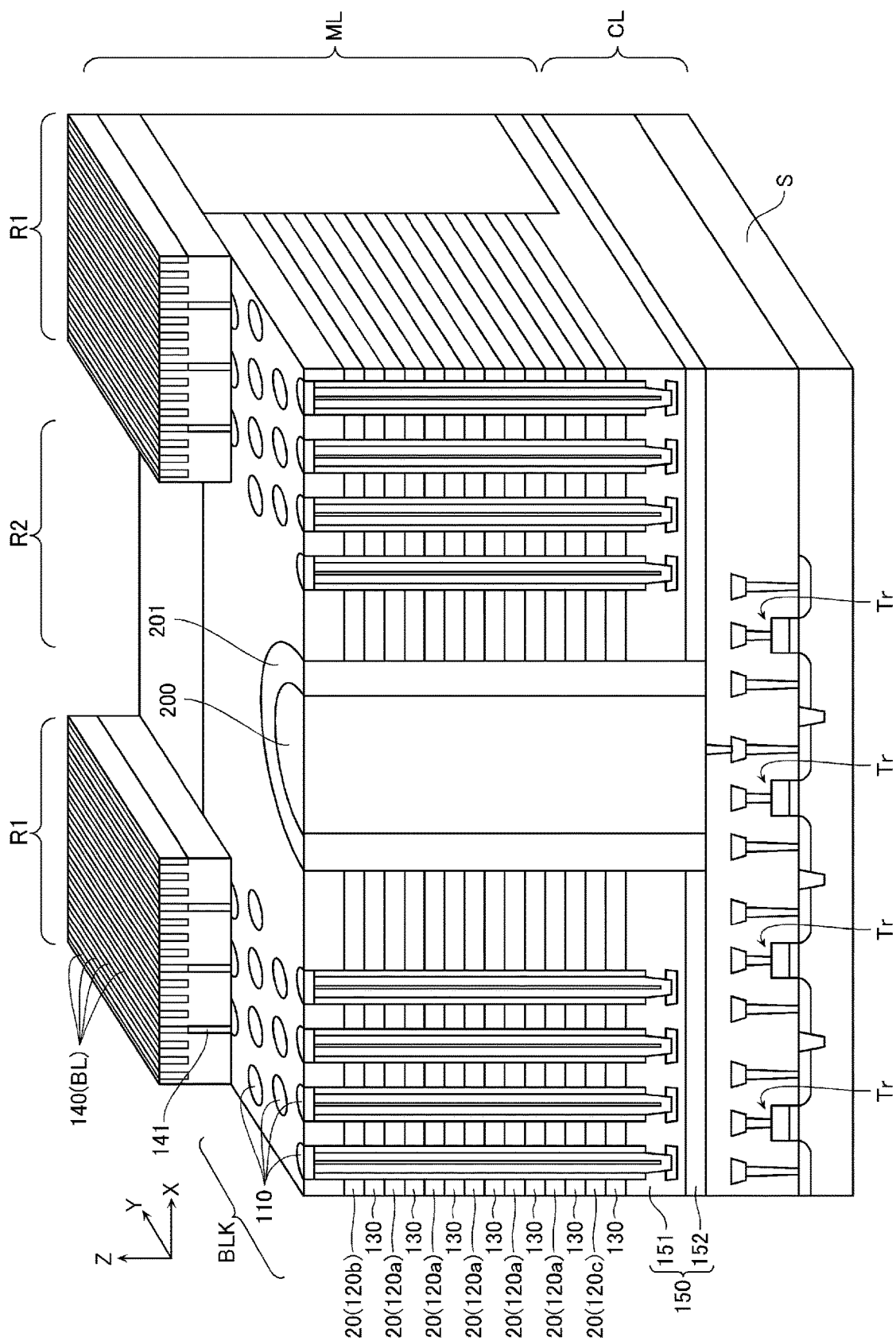
FIG. 8 is a schematic perspective view corresponding to a portion indicated by B in FIG. 5.
Figure 9:
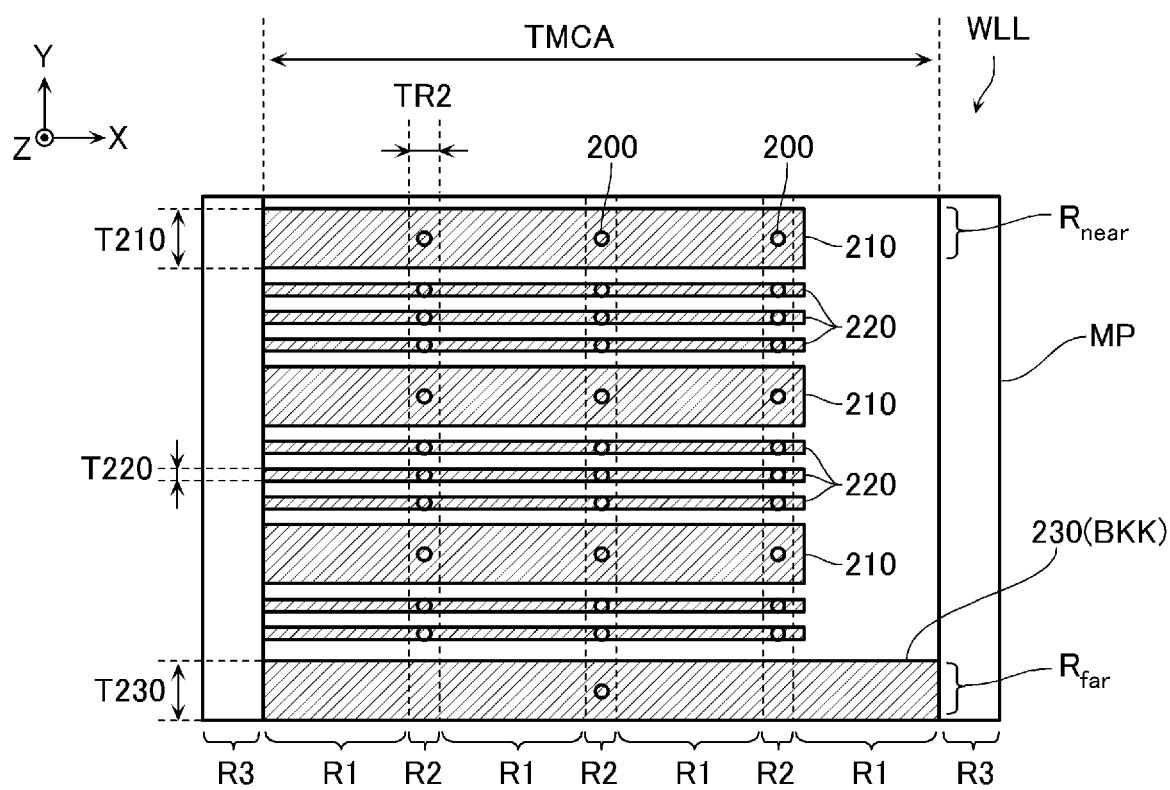
FIG. 9 is a schematic plan view illustrating the same configuration example as FIG. 1.

Next, a configuration example of the semiconductor memory device according to the first embodiment will be described with reference to FIGS. 5 to 9. FIG. 5 is a schematic plan view illustrating a configuration example of the semiconductor memory device according to this embodiment. FIG. 6 is a schematic perspective view illustrating the configuration example of the semiconductor memory device according to this embodiment. FIG. 7 is a schematic perspective view corresponding to a portion indicated by A in FIG. 5. FIG. 8 is a schematic perspective view corresponding to a portion indicated by B in FIG. 5. FIG. 9 is a schematic plan view illustrating a configuration example of the semiconductor memory device according to this embodiment. FIGS. 5 to 9 illustrate schematic configurations, and the specific configurations may be changed as appropriate. In FIGS. 5 to 9, a part of the configuration is omitted.

As illustrated in FIG. 5, the memory die MD according to this embodiment includes four memory plane regions MP aligned in the X-direction and the Y-direction, and a pad region PAD provided at one end of the memory die MD in the Y-direction. Each of the memory plane regions MP includes the memory cell array MCA. The pad region PAD includes a plurality of external pad electrodes. The plurality of external pad electrodes are connected to, for example, a controller, another memory die MD, or the like via bonding wires. These plurality of external pad electrodes function as the data input/output terminals I/O0 to I/O7, the external control terminals /CEn, CLE, ALE, /WE, and /RE, and the voltage supply terminals connected to the power supply voltage supply line VCC and the ground voltage supply line VSS.

Memory Plane Region MP

For example, as illustrated in FIG. 6, the memory plane region MP includes a memory layer ML, a circuit layer CL provided below the memory layer ML, and an upper wiring layer WLL provided above the memory layer ML.

Memory Layer ML

The memory layer ML includes a plurality of memory cell array regions R1 and through-contact regions R2 that are alternately arranged in the X-direction, and word line contact regions R3 provided at both ends in the X-direction of the plurality of memory cell array regions R1 and through-contact regions R2 (FIGS. 6 and 7).

The memory cell array region R1 includes the memory cell array MCA. As illustrated in FIG. 5, the memory cell array MCA includes a plurality of memory blocks BLK arranged in the Y-direction. Between two memory blocks BLK adjacent in the Y-direction, an inter-block insulating layer ST extending in the X-direction is provided, for example, as illustrated in FIG. 7.

As illustrated in FIG. 7, the memory block BLK includes a plurality of memory structures 110 extending in the Z-direction, a plurality of conductive layers 120 covering the outer peripheral surfaces of the plurality of memory structures 110 and extending in the Z-direction, a plurality of insulating layers 130 disposed between the plurality of conductive layers 120, a plurality of wirings 140 connected to the upper ends of the memory structures 110, and a lower wiring layer 150 connected to the lower ends of the memory structures 110 (FIG. 7).

The memory structures 110 are arranged in a predetermined pattern in the X and Y-directions. Each memory structure 110 includes a semiconductor layer 111 extending in the Z-direction, a gate insulating layer 112 provided between the semiconductor layer 111 and the conductive layer 120, a semiconductor layer 113 connected to the upper end of the semiconductor layer 111, and an insulating layer 114 provided at the central portion of the memory structure 110.

The semiconductor layer 111 functions as, for example, a channel region of a plurality of memory cells MC and a drain select transistor STD in one memory string MS (FIG. 2). The semiconductor layer 111 has a substantially cylindrical shape, and the insulating layer 114 such as silicon oxide (SiO$_2$) is embedded in the central portion thereof. The semiconductor layer 111 is a semiconductor layer made of, for example, undoped polycrystalline silicon (Si).

The gate insulating layer 112 extends in the Z-direction along the outer peripheral surface of the semiconductor layer 111. The gate insulating layer 112 includes a tunnel insulating layer, a charge storage layer, and a block insulating layer stacked between the semiconductor layer 111 and the conductive layer 120. The tunnel insulating layer and the block insulating layer are insulating layers such as silicon oxide (SiO$_2$), for example. The charge storage layer is a layer capable of storing charges, such as silicon nitride (SiN), for example. The charge storage layer may form a plurality of floating gates arranged in the Z-direction. Such a floating gate contains, for example, polycrystalline silicon (Si) containing N-type impurities such as phosphorus (P).

The semiconductor layer 113 is a semiconductor layer such as polycrystalline silicon (Si) containing an N-type impurity such as phosphorus (P).

A plurality of conductive layer 120 are arranged in the Z-direction with the insulating layer 130 interposed therebetween, and each conductive layer 120 is a substantially plate-like conductive layer extending in the X-direction and the Y-direction. These conductive layers 120 have a plurality of through-holes formed in a predetermined pattern, and the memory structures 110 are respectively provided in the through-holes. The conductive layer 120 includes, for example, titanium nitride (TiN), tungsten (W), or a stacked film thereof.

Some of conductive layers 120a function as word lines WL (FIG. 2) and gate electrodes of a plurality of memory cells MC (FIG. 2) connected to the word lines WL, respectively. The conductive layer 120b provided above the plurality of conductive layers 120a functions as the gate electrode of the drain selection line SGD (FIG. 2) and the plurality of drain select transistors STD (FIG. 2) connected to the drain selection line SGD. A conductive layer 120c provided below the plurality of conductive layers 120a functions as the source selection line SGS (FIG. 2) and the gate electrodes of the plurality of source select transistors STS connected the source selection line SGS.

Each of the insulating layers 130 is provided between two conductive layers 120 arranged in the Z-direction. The insulating layer 130 is an insulating film such as silicon oxide (SiO$_2$).

The wiring 140 functions as the bit line BL. A plurality of wirings 140 are arranged in the X-direction and extend in the Y-direction. Each wiring 140 is connected to the semiconductor layer 111 via a contact 141 and the semiconductor layer 113. For example, as illustrated in FIG. 6, one ends of the wirings 140 in the Y-direction are connected to elements in the circuit layer CL via bit line contacts BL'.

For example, as illustrated in FIG. 7, the lower wiring layer 150 includes a conductive layer 151 connected to the semiconductor layers 111 and a conductive layer 152 provided on the lower surface of the conductive layer 151. The lower wiring layer 150 functions as the lower wiring SC (FIG. 2). The conductive layer 151 includes, for example, a conductive film such as polycrystalline silicon (Si) containing N-type impurities such as phosphorus (P). The conductive layer 152 includes, for example, a conductive film such as polycrystalline silicon (Si) or silicide including N-type impurities such as metal such as tungsten (W) or phosphorus (P).

For example, as illustrated in FIG. 8, the through-contact region R2 includes a part of the plurality of conductive layers 120 and plurality of insulating layers 130 and a plurality of through-contacts 200 penetrating through the plurality of conductive layers 120 and the plurality of insulating layers 130 and extending in the Z-direction. The plurality of through-contacts 200 connect the wirings in the upper wiring layer WLL provided above the memory cell array MCA and the wirings in the circuit layer CL provided below the memory cell array MCA. Each through-contact 200 includes, for example, titanium nitride (TiN), tungsten (W), or a stacked film thereof. The plurality of through-contacts 200 are insulated from the plurality of conductive layers 120 via insulating layers 201 such as silicon oxide (SiO$_2$). The memory structure 110 and the wiring 140 are not provided in the through-contact region R2. Although only one through-contact 200 is illustrated in FIG. 8, a plurality of through-contacts 200 may be provided in the through-contact region R2.

For example, as illustrated in FIG. 7, a word line contact region R3 includes a part of the plurality of conductive layers 120 and the plurality of insulating layers 130, and the plurality of contacts 160 connected to the plurality of conductive layers 120. Each contact 160 extends in the Z-direction, and the lower end thereof is connected to each of contact portions 161 provided at end portions in the X-direction of the plurality of conductive layers 120. Each contact 160 includes, for example, titanium nitride (TiN), tungsten (W), or a stacked film thereof.

Circuit Layer CL

For example, as illustrated in FIG. 6, the circuit layer CL includes a peripheral circuit region PERI. The row decoders RD are provided in regions extending in the Y-direction at both ends in the X-direction of the peripheral circuit region PERI. The sense amplifier module SAM is provided in a region on one side in the Y-direction among these regions between the row decoders RD. Among the regions between the row decoders RD, another circuit in the peripheral circuit PC (FIG. 1) such as the kick line driver 12 is provided in the region on the other side in the Y-direction.

The regions where the row decoders RD of the circuit layer CL are provided overlap the word line contact region R3 of the memory layer ML when viewed along the Z-direction. The regions between the row decoders RD overlap the memory cell array region R1 and the through-contact region R2 when viewed along the Z-direction.

As illustrated in FIG. 7, for example, the circuit layer CL includes a substrate S, a plurality of transistors Tr of the peripheral circuit PC, and a plurality of wirings and contacts connected to the plurality of transistors Tr.

The substrate S is a semiconductor substrate made of, for example, single crystal silicon (Si). The substrate S has, for example, a double well structure having an N-type impurity layer such as phosphorus (P) on the front surface of the semiconductor substrate and further having a P-type impurity layer such as boron (B) in the N-type impurity layer.

For example, as illustrated in FIG. 8, each transistor Tr is connected to each wiring in the upper wiring layer WLL provided above the memory layer ML via the through-contact 200 provided in the through-contact region R2.

Upper Wiring Layer WLL

FIG. 9 is a schematic plan view for illustrating the upper wiring layer WLL. As illustrated in FIG. 9, the upper wiring layer WLL includes a plurality of wiring members 210, 220, and 230 that extend in the X-direction and are arranged in the Y-direction. The plurality of wiring members 210, 220, and 230 are provided immediately above the bit line BL and face the upper surface of the bit line BL. The wiring members 210, 220, and 230 include a conductive material such as aluminum (Al) or copper (Cu), for example.

The wiring member 210 functions as, for example, the power supply voltage supply line VCC, the ground voltage supply line VSS, or another voltage supply line connected to the output terminal of the voltage generation circuit VG. The plurality of wiring members 210 extend in the X-direction, and are connected to the through-contacts 200 in each of the through-contact regions R2 arranged in the X-direction. The wiring member 210 is connected to the external pad electrode or the output terminal of the voltage generation circuit VG via the wiring provided above the upper wiring layer WLL. A length of the wiring member 210 in the X-direction is smaller than a length TMCA of the memory cell array MCA in the X-direction. Accordingly, the wiring member 210 does not face the upper surface of the bit line BL in a part of the memory cell array region R1.

The wiring member 220 functions as, for example, any of the signal lines described above. The plurality of wiring members 220 extend in the X-direction, and are connected to the through-contacts 200 in each of the through-contact regions R2 arranged in the X-direction. The wiring member 220 is connected to the sequencer SQC and the like via the wiring provided above the upper wiring layer WLL. A length of the wiring member 220 in the X-direction is smaller than the length TMCA of the memory cell array MCA in the X-direction. Accordingly, the wiring member 220 does not face the upper surface of the bit line BL in a part of the memory cell array region R1.

The wiring member 230 functions as the bit line-kick line BKK (FIG. 2). The wiring member 230 is connected to only one through-contact 200. In the illustrated example, the wiring member 230 is not connected to any wiring provided above the upper wiring layer WLL. The wiring member 230 faces a partial region of the upper surface of all the bit lines BL in the memory cell array MCA. Accordingly, a length in the X-direction of the wiring member 230 is greater than or equal to the length TMCA in the X-direction of the memory cell array MCA. The length TMCA in the X-direction of the memory cell array MCA may be a distance from a side surface on one end side in the X-direction of the bit line BL provided closest to one end side in the X-direction, among the plurality of bit lines BL in the memory cell array MCA, to a side surface on the other end side in the X-direction on the bit line BL provided closest to the other end side in the X-direction.

The plurality of bit lines BL in the memory cell array MCA are connected to the contact BL' (FIG. 6) at one end portion thereof in the Y-direction and face the bit line-kick line BKK (wiring member 230) at the other end portion. Hereinafter, a region including one end portion of the bit line BL may be referred to as a region Rnear. A region including the other end portion of the bit line BL may be referred to as a region Rfar.

In the example of FIG. 9, a wiring width T210 of the wiring member 210 and a wiring width T230 of the wiring member 230 are larger than a length TR2 in the X-direction of the through-contact region R2. The length TR2 in the X-direction of the through-contact region R2 is larger than a wiring width T220 of the wiring member 220. The "wiring width" here refers to a wiring width in a direction (for example, the Y-direction) perpendicular to an extending direction (for example, the X-direction) of the wiring and the film thickness direction (for example, the Z-direction) of the wiring. For example, when attention is paid to one through-contact region R2, the length TR2 in the X-direction of the through-contact region R2 represents a distance from the bit line BL closest to the through-contact region R2, among the plurality of bit lines BL provided on one side in the X-direction with respect to the through-contact region R2, to the bit line BL closest to the through-contact region R2, among the plurality of bit lines BL provided on the other side in the X-direction with respect to the through-contact region R2.

First Read Operation

Next, a first read operation of the semiconductor memory device according to this embodiment will be described with reference to FIG. 10 and the like.

In the first read operation, a control signal is output from the sequencer SQC (FIG. 1) and "1" is latched at the node LAT of the data latch SDL of the sense amplifier unit SAU (FIG. 4) to turn the charging transistor 37 to an ON state turn the discharging transistor 38 an OFF state (FIG. 4).

At timing T101, a control signal is output from the sequencer SQC (FIG. 1) and a predetermined ON voltage is supplied to the select gate lines (SGD and SGS) corresponding to address data and a predetermined read pass voltage VREAD is supplied to a non-selected word line WL to turn the select transistors (STD and STS) and a non-selected memory cell MC to an ON state. With this configuration, the selected memory cell MC becomes conductive with the bit line BL and the source line SL.

At timing T101, a control signal is output from the sequencer SQC (FIG. 1) and a predetermined read voltage VWL is supplied to the selected word line WL. With this configuration, for example, the memory cell MC in which data "0" is recorded enters an OFF state and the memory cell MC in which data "1" is recorded enters an ON state.

At timing T102, a control signal is output from the sequencer SQC (FIG. 1) and voltages of the signal line BLX, the signal line HHL, the signal line BLC, and the signal line BLS in FIG. 4 are raised to turn the charging transistor 36, the charging transistor 39, the clamp transistor 11, and the breakdown voltage transistor 31 in the sense amplifier unit SAU to an ON state. With this configuration, charging of the bit line BL and the sense node SEN is started. The source line SL becomes conductive with the voltage supply line VSRC described above via a source line driver (not illustrated).

At timing T102, a control signal is output from the sequencer SQC (FIG. 1) and a predetermined voltage VBKK is supplied to the bit line-kick line BKK.

At timing T103, a control signal is output from the sequencer SQC (FIG. 1) and the voltage of the signal line HHL is lowered to turn the charging transistor 39 to an OFF state and the voltage of the signal line XXL is raised to turn the discharging transistor 33 to an ON state. With this configuration, the sense node SEN becomes conductive with the selected memory cell MC via the bit line BL and discharging of the sense node SEN is started in accordance with the data stored in the memory cell MC.

That is, several of the sense nodes SEN in the plurality of sense amplifier units SAU become conductive with the source line SL via the selected memory cell MC which is an ON state. Accordingly, the charges at the sense node SEN flow to the source line SL via the bit line BL and the voltage at the sense node SEN is greatly reduced. On the other hand, several of the sense nodes SEN become conductive with the selected memory cell MC in which is in an OFF state and do not become conductive with the source line SL. Accordingly, the voltage at the sense node SEN is not greatly reduced.

At timing T104, a control signal is output from the sequencer SQC (FIG. 1) and the voltage of the signal line XXL is raised to turn the discharging transistor 33 to an OFF state. With this configuration, discharging of the sense node SEN is completed.

At timing T105, a control signal is output from the sequencer SQC (FIG. 1) and the voltages of the signal line STB and the signal line STL are raised to turn the switch transistor 34 and the switch transistor 43 to an ON state. With this configuration, data indicating whether the memory cell MC is in the ON state or the OFF state is latched at the node LAT of the data latch SDL. Thereafter, the acquired data is output via the bus DB, the input/output control circuit I/O, and the like.

At timing T105, a control signal is output from the sequencer SQC (FIG. 1) and all the bit lines BL are made conductive by an equalizer circuit (not illustrated) to bring the voltages of all the bit lines BL to close a constant voltage.

At timing T106, a control signal is output from the sequencer SQC (FIG. 1) and "0" is latched at the node LAT of the data latch SDL of the sense amplifier unit SAU (FIG. 4) to turn the charging transistor 37 to an OFF state and turn the discharging transistor 38 to an ON state (FIG. 4). With this configuration, discharging of the bit line BL is started.

At timing T106, a control signal is output from the sequencer SQC (FIG. 1) and the bit line-kick line BKK is made conductive with the ground voltage supply line VSS. With this configuration, discharging of the bit line-kick line BKK is started.

At timing T107, a control signal is output from the sequencer SQC (FIG. 1) and the select gate lines (SGD and SGS), the non-selected word line WL, and the selected word line WL are made conductive with the ground voltage supply line VSS. With this configuration, discharging of the select gate lines (SGD and SGS), the non-selected word line WL, and the selected word line WL is started.

Second Read Operation

Next, for comparison with the first read operation, the second read operation of the semiconductor memory device according to this embodiment will be described with reference to FIG. 11.

Figure 11:
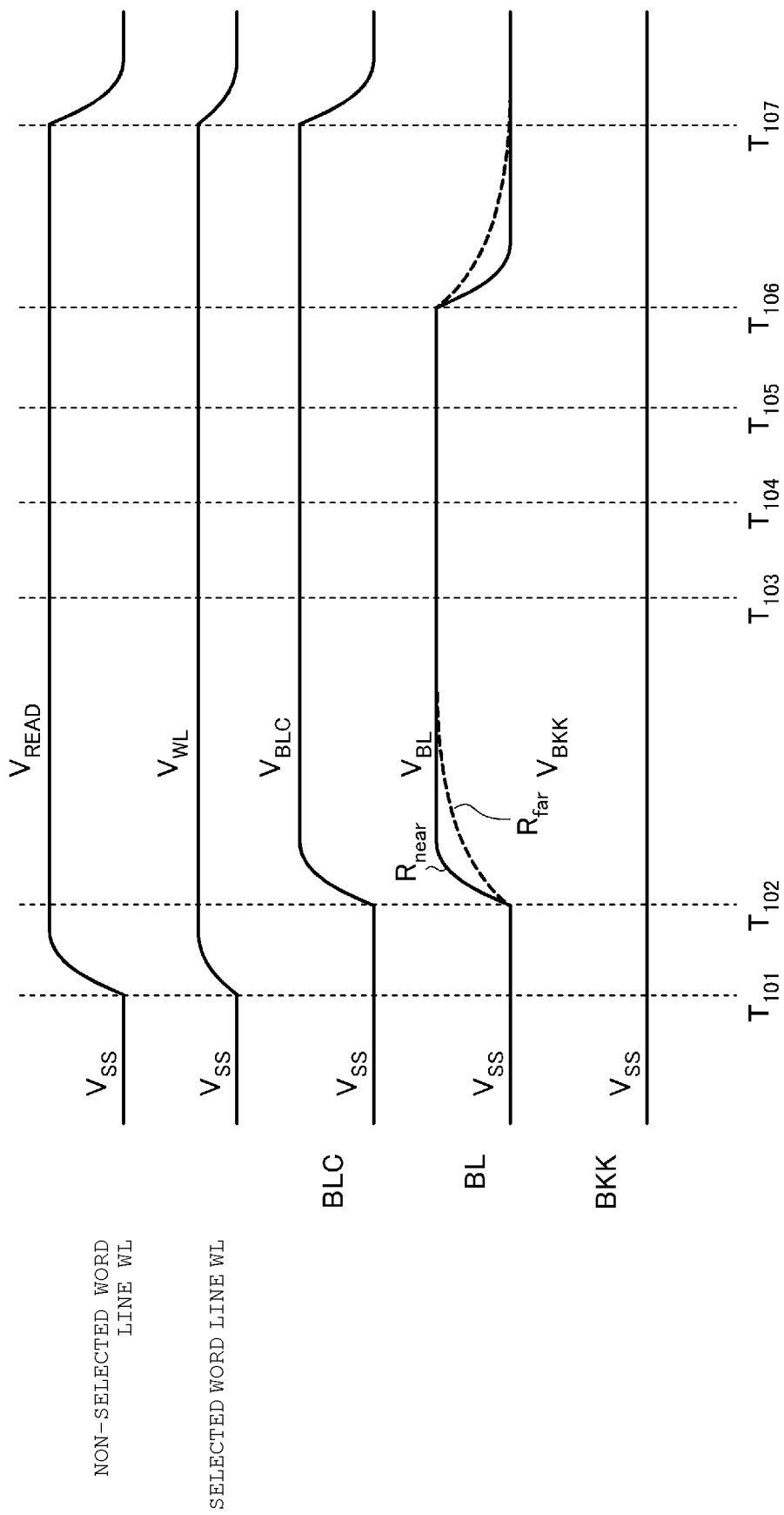
FIG. 11 is a schematic waveform diagram for illustrating a second read operation of the same semiconductor memory device as FIG. 1.

As illustrated in FIG. 11, the second read operation is performed in the same manner as the first read operation. However, in the second read operation, the bit line-kick line BKK is always in conduction with the ground voltage supply line VSS.

Effect

For example, as illustrated in FIG. 6, the portion provided in the region Rnear of the bit line BL has a short wiring distance from the sense amplifier unit SAU. Accordingly, when the bit line BL is charged, a target voltage VBL is reached in a relatively short time. On the other hand, the portion provided in the region Rfar (FIG. 6) of the bit line BL has a long wiring distance from the sense amplifier unit SAU. Accordingly, charging takes a relatively long time. Accordingly, in the second read operation, as indicated by a solid line (Rnear) and a dotted line (Rfar) in FIG. 11, there may be a difference in the time required to reach the predetermined target voltage VBL between the portion provided in the region Rnear and the portion provided in the region Rfar of the bit line BL. Similarly, when the bit line BL is discharged, there is a difference in time required to reach a predetermined voltage between the portion provided in the region Rnear and the portion provided in the region Rfar of the bit line BL.

Figure 10:
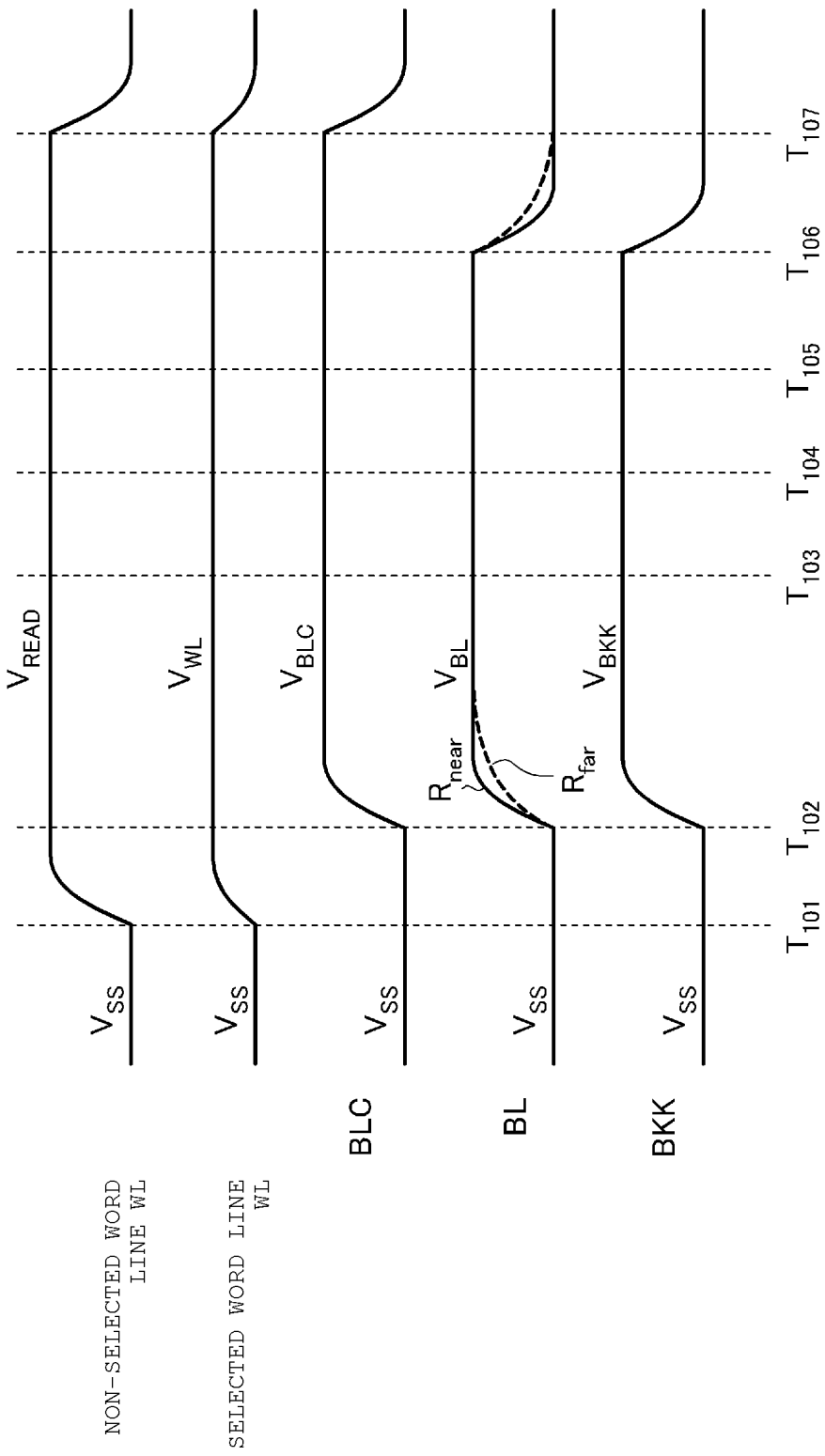
FIG. 10 is a schematic waveform diagram for illustrating a first read operation of the same semiconductor memory device as FIG. 1.

Therefore, the semiconductor memory device according to the first embodiment illustrated in FIG. 10 includes the bit line-kick line BKK facing the upper surface of the end portion of the bit line BL in the region Rfar. According to such a configuration, it is possible to execute the first read operation that can be executed faster than the second read operation.

That is, as illustrated in FIG. 10, for example, in the first read operation, the voltage of the bit line-kick line BKK is raised at timing T102 when the charging of the bit line BL is started. Here, as described above, since the bit line-kick line BKK and the plurality of bit lines BL constitute the capacitor Cap, when the voltage of the bit line-kick line BKK is raised, the voltage of the portion provided in the region Rfar of the bit line BL also rises due to capacitive coupling. With this configuration, all bit lines BL can be charged at high speed. In the first read operation, the voltage of the bit line-kick line BKK is lowered at the timing T106 when discharging of the bit line BL is started. With this configuration, all bit lines BL can be discharged at high speed. Accordingly, the first read operation can be performed at a higher speed than the second read operation.

CONFIGURATION EXAMPLE OF BIT LINE-KICK LINE BKK

Next, the configuration of the bit line-kick line BKK will be described with reference to FIGS. 12 to 15. FIGS. 12 to 15 are schematic plan views illustrating configuration examples of the bit line-kick line BKK.

First Configuration Example

Figure 12:
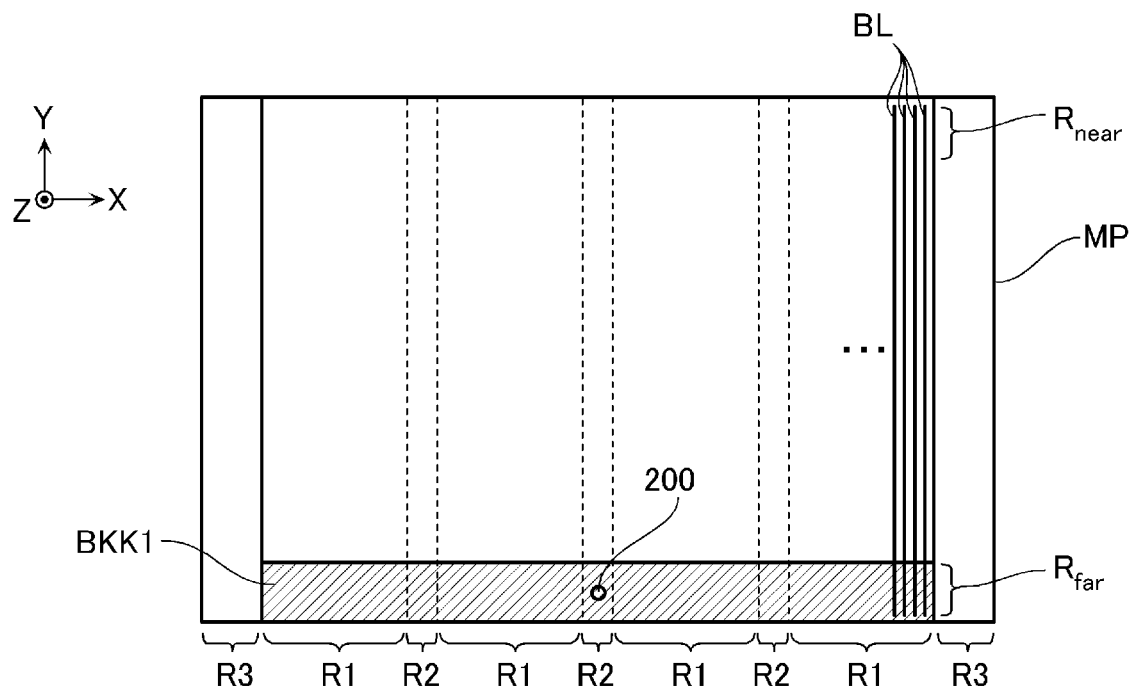
FIG. 12 is a schematic top view illustrating a first configuration example of the semiconductor memory device according to the first embodiment.

As illustrated in FIG. 12, the bit line-kick line BKK1 according to the first configuration example has a rectangular shape extending in the X-direction.

Second Configuration Example

Figure 13:
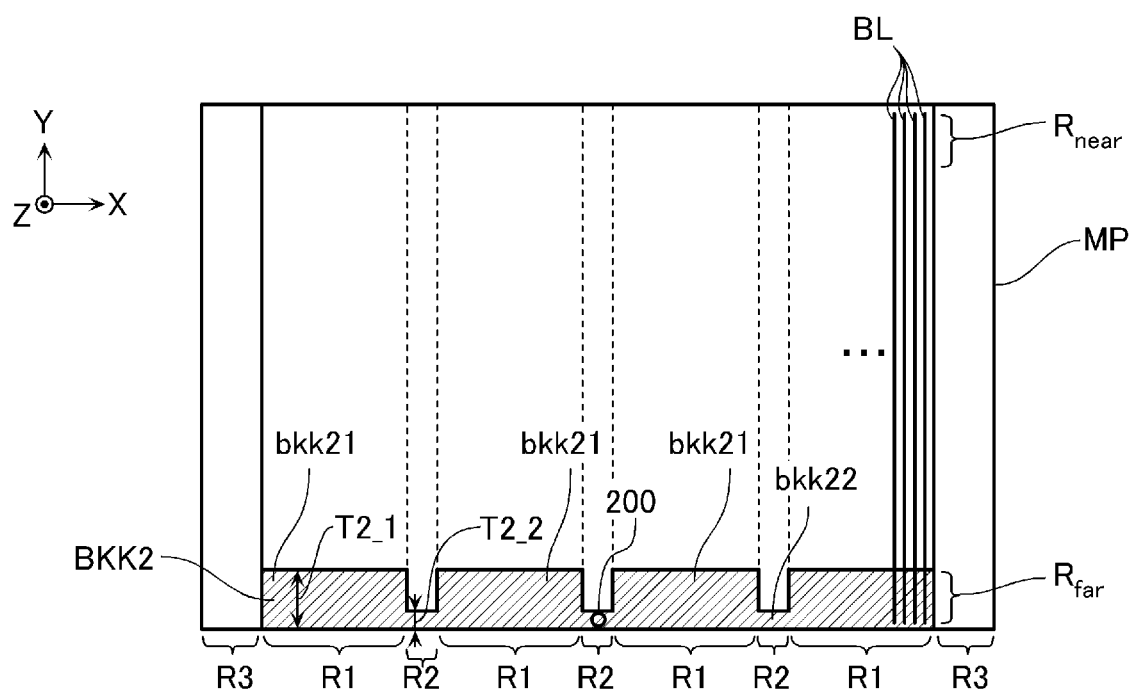
FIG. 13 is a schematic top view illustrating a second configuration example of the semiconductor memory device according to the first embodiment.

As illustrated in FIG. 13, a bit line-kick line BKK2 according to the second configuration example includes a plurality of first portions bkk21 arranged in the X-direction and a plurality of second portions bkk22 provided between the plurality of first portions bkk21. The plurality of first portions bkk21 are respectively provided in the memory cell array region R1, and face the upper surface of partial regions of the plurality of bit lines BL provided in the memory cell array region R1. The plurality of second portions bkk22 are electrically conducted with the plurality of first portions bkk21. In the illustrated example, a width T2_1 in the Y-direction of the first portion bkk21 is larger than a width T2_2 in the Y-direction of the second portion bkk22. In the illustrated example, a side surface on one side in the Y-direction of the first portion bkk21 and a side surface on one side in the Y-direction of the second portion bkk2 are provided along a straight line extending in the X-direction.

Third Configuration Example

Figure 14:
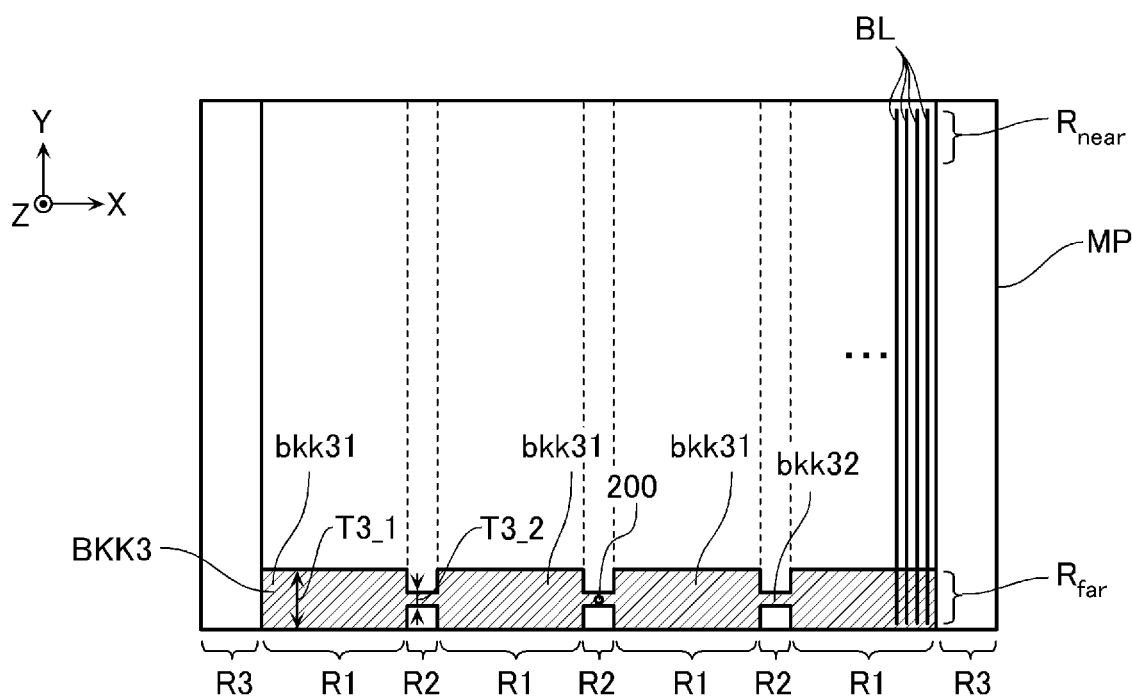
FIG. 14 is a schematic top view illustrating a third configuration example of the semiconductor memory device according to the first embodiment.

As illustrated in FIG. 14, a bit line-kick line BKK3 according to the third configuration example includes a plurality of first portions bkk31 arranged in the X-direction and a plurality of second portions bkk32 provided between the plurality of first portions bkk31. The plurality of first portions bkk31 are respectively provided in the memory cell array region R1, and face the upper surface of partial regions of the plurality of bit lines BL provided in the memory cell array region R1. The plurality of second portions bkk32 are electrically conducted with the plurality of first portions bkk31. In the illustrated example, a width T3_1 in the Y-direction of the first portion bkk31 is larger than a width T3_2 in the Y-direction of the second portion bkk32. In the illustrated example, the center position of the first portion bkk31 in the Y-direction and the center position of the second portion bkk32 in the Y-direction substantially coincide with each other.

Fourth Configuration Example

Figure 15:
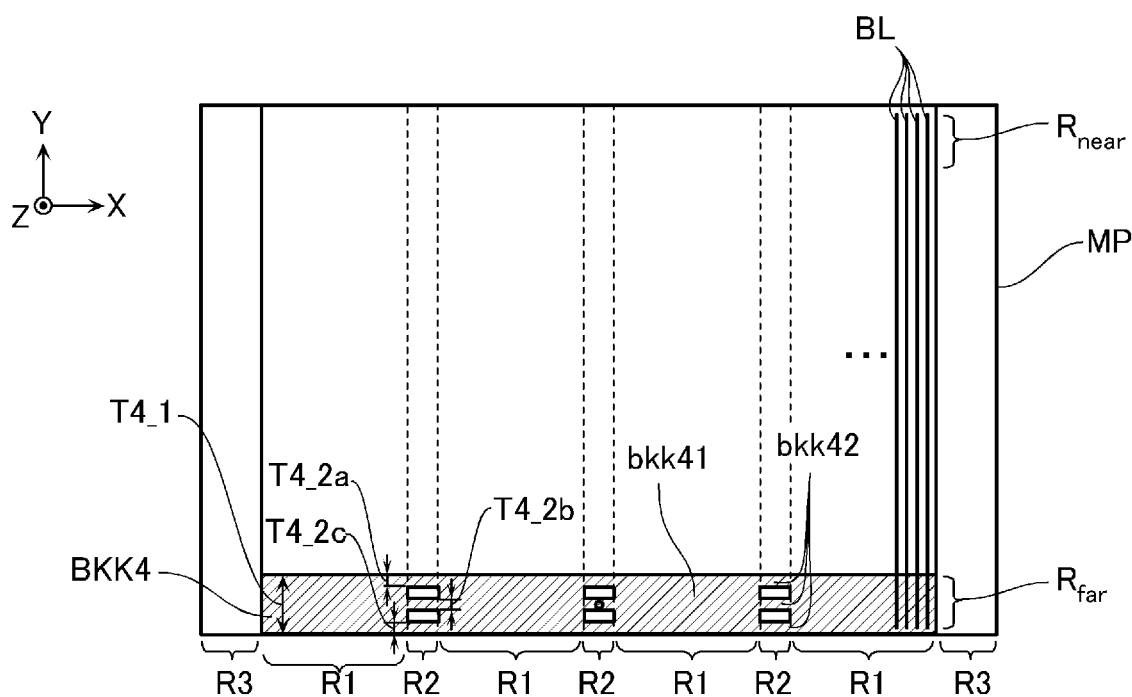
FIG. 15 is a schematic top view illustrating a fourth configuration example of the semiconductor memory device according to the first embodiment.

As illustrated in FIG. 15, a bit line-kick line BKK4 according to the fourth configuration example includes a plurality of first portions bkk41 arranged in the X-direction and a plurality of second portions bkk42 provided between the plurality of first portions bkk41. The plurality of first portions bkk41 arranged in the X-direction are connected to each other via the plurality of second portions bkk42 arranged in the Y-direction. The plurality of first portions bkk41 are respectively provided in the memory cell array region R1, and face the upper surface of partial regions of the plurality of bit lines BL provided in the memory cell array region R1. The plurality of second portions bkk42 are electrically conducted with the plurality of first portions bkk41. In the illustrated example, a width T4_1 in the Y-direction of the first portion bkk41 is larger than the sum of the widths T4_2a, T4_2b, and T4_2c in the Y-direction of the plurality of second portions bkk42 arranged in the Y-direction.

Voltage of Bit Line-Kick Line BKK

The voltage supplied to each wiring in the read operation or the like may vary due to the influence of temperature or the like. For example, the voltage of the voltage supply line VSRC may vary due to the influence of temperature or the like. Here, in order to prevent erroneous reading or the like, it is preferable to adjust the voltage supplied to the bit line BL and the voltage supplied to the bit line-kick line BKK in response to variation in the voltage supply line VSRC. In order to adjust the voltage of the bit line BL, for example, it is conceivable to adjust at least one of the voltages of the signal line BLC and the voltage of the voltage supply line VDD. In order to adjust the voltage of the bit line-kick line BKK, for example, it is conceivable to adjust at least one of the voltages of the signal line BLCPL and the voltage of the voltage supply line connected to the bit line-kick line BKK. Such voltage adjustment may be executed by adjusting a signal input to the charge pump circuit in the voltage generation circuit VG, for example. For example, any one of the voltages described above may be generated by the charge pump circuit, and another voltage may be generated by stepping down an output voltage of the charge pump circuit using a regulator or the like.

Other Embodiments

The semiconductor memory device according to the embodiment has been described as above. However, the description as above is merely an example, and the configuration, method, and the like described above may be adjusted as appropriate.

For example, as described with reference to FIG. 6, FIG. 7, and the like, in the semiconductor memory device according to the first embodiment, the memory cell array MCA is provided apart from the substrate S, and the circuit layer CL including the plurality of transistors Tr is provided below the memory cell array MCA. However, for example, the memory cell array MCA may be provided on the surface of the substrate S. In such a case, for example, the memory structure 110 may be connected to the surface of the substrate S. The lower wiring layer 150 may be omitted.

For example, as described with reference to FIG. 6 and the like, in the semiconductor memory device according to the first embodiment, the kick line driver 12 is provided in the peripheral circuit region PERI. However, the kick line driver 12 may be provided in other regions. For example, the kick line driver 12 may be provided in a region other than the memory plane region MP. In such a case, the through-contact 200 may not be connected to the wiring member 230 that functions as the bit line-kick line BKK. The wiring member 230 may instead be connected to the kick line driver 12 via a wiring provided above the upper wiring layer WLL.

For example, in the example of FIG. 9, the bit line-kick line BKK is connected to the elements in the circuit layer CL via one of the plurality of through contacts provided in the through-contact region R2 (e.g., through-contact 200). However, the bit line-kick line BKK may be connected to the elements in the circuit layer CL through two or more through-contacts 200, for example. The number of such through-contacts 200 may be the same as the number of through-contact regions R2 in the memory plane region MP, or less than the number of through-contact regions R2 in the memory plane region MP.

For example, in the example of FIG. 9, the wiring width T230 of the bit line-kick line BKK is larger than the length TR2 of the through-contact region R2 in the X-direction. However, the wiring width T230 of the bit line-kick line BKK may be smaller than the length TR2 of the through-contact region R2 in the X-direction. In such a case, for example, a breakdown voltage transistor may be connected to the bit line-kick line BKK, and the voltage VBKK of the bit line-kick line BKK in the first read operation may be set to a voltage of 10 V or more.

For example, in the example of FIG. 10, a normal read operation is illustrated as the first read operation. However, the method as described with reference to FIG. 10 may be applied to other read operations. Examples of other read operations include a verification operation when a write sequence is executed, an erase verification operation when an erase sequence is executed, and the like.

For example, in the example of FIG. 10, an example in which the read voltage VWL of the selected word line WL is one and the charging/discharging of the sense node SEN is performed only once. Such a method exemplifies, for example, a read operation of the memory cell MC storing 1-bit data, a read operation of a lower page of the memory cell MC to which the 1-3-3 code is assigned, and the like. However, the method as described with reference to FIG. 10 may be applied to other read operations.

For example, in the read operation of the memory cell MC to which data of a plurality of bits such as 2 bits, 3 bits, 4 bits, and the like is allocated, the adjustment of the voltage of the selected word line WL and the charging/discharging of the sense node SEN may be repeatedly executed from the timing corresponding to the timing T102 in FIG. 10 to the timing corresponding to the timing T106 in some cases. In such a case, for example, when the voltage of the selected word line WL increases, the number of memory cells MC that enter an ON state may be increased and the voltage of a part of the bit lines BL may be reduced, and thus the voltages of all the bit lines BL may be reduced due to capacitive coupling between the bit lines BL. In such a case, for example, the voltage of the bit line-kick line BKK may be raised only at the timing T102. The voltage of the bit line-kick line BKK may be raised one step at the timing T102, and then the voltage of the bit line-kick line BKK may be raised little by little every time the voltage of the selected word line WL is increased.

For example, in the example of FIG. 10, the voltage of the signal line BLC and the voltage of the bit line-kick line BKK rise simultaneously at the timing T102. However, the voltage of the signal line BLC and the voltage of the bit line-kick line BKK may be raised at different timings. For example, the voltage of the bit line-kick line BKK may be raised later than the voltage of the signal line BLC, or may be raised earlier than the voltage of the signal line BLC. Similarly, the voltage of the signal line BLC and the voltage of the bit line-kick line BKK may be lowered at different timings.

In the first embodiment, the bit line-kick line BKK faces a partial region on the upper surface of the bit line BL. However, the bit line-kick line BKK may face a partial region on the lower surface of the bit line BL, or may face a partial region on the upper surface and a partial region on the lower surface of the bit line BL.

In the first embodiment, the bit line-kick line BKK is implemented by one wiring member 230 in the upper wiring layer WLL. However, the bit line-kick line BKK may also be implemented by a plurality of wiring members arranged in the X-direction. In such a case, for example, in the bit line-kick lines BKK2 to BKK4 described with reference to FIG. 13 to FIG. 15, it is also possible to use a wiring member having a shape in which a part or all of the second portions bkk22 to bkk24 are omitted.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory block;
   a second memory block arranged with the first memory block along a first direction;
   a first bit line extending in the first direction and including a first portion through which the first memory block is connected to the first bit line and a second portion through which the second memory block is connected to the first bit line;
   a first sense amplifier connected to the first bit line;
   a first wiring which extends in a second direction intersecting the first direction, and overlaps the second portion of the first bit line when viewed in a third direction intersecting the first direction and the second direction; and
   a controller which applies a first voltage to the first bit line, and a second voltage to the first wiring during a read operation;
   wherein, a first distance between the first sense amplifier and the first portion is shorter than a second distance between the first sense amplifier and the second portion.

2. The semiconductor memory device according to claim 1, wherein the first memory block and the second memory block include
   a plurality of transistors on a semiconductor substrate which are disposed at positions different from the memory blocks in the third direction,
   a wiring layer that is disposed above the first bit line and includes the first wiring and a plurality of second wirings, and
   a plurality of contacts that extend in the third direction and connects at least a part of the plurality of transistors and at least a part of the second wirings.

3. The semiconductor memory device according to claim 2, wherein a width of the first wiring in the first direction is greater than or equal to a width of the second wirings in the first direction.

4. The semiconductor memory device according to claim 2, wherein a width of the first wiring in the first direction is greater than a distance between two bit lines adjacent in the second direction that are on either side of one of the plurality of contacts in the second direction.

5. The semiconductor memory device according to claim 2, wherein the plurality of memory blocks include a plurality of memory cell array regions arranged in the second direction and a plurality of contact regions including the plurality of contacts which are not connected to the first wiring, provided between the plurality of memory cell array regions.

6. The semiconductor memory device according to claim 2, wherein
the plurality of memory blocks include a plurality of memory cell array regions arranged in the second direction and a plurality of contact regions including the plurality of contacts, and
the number of the contacts connected to the first wiring is smaller than the number of the contact regions arranged in the second direction.

7. The semiconductor memory device according to claim 1, wherein the first wiring includes a plurality of first parts that are arranged in the second direction and overlaps bit lines when viewed along the third direction, and a plurality of second parts that are connected to two of the first parts that are adjacent in the second direction.

8. The semiconductor memory device according to claim 7, wherein a width of the plurality of first parts in the first direction is larger than a width of the plurality of second parts in the first direction.

9. The semiconductor memory device according to claim 7, wherein the plurality of second parts include at least one slit.

10. A semiconductor memory device comprising:
a plurality of memory blocks, including first and second memory blocks, that are arranged in a first direction;
a plurality of bit lines that extend in the first direction and are arranged in a second direction intersecting the first direction;
a peripheral circuit that is connected to one ends of the plurality of bit lines in the first direction; and
a first wiring that extends in the second direction, overlaps the other ends of the plurality of bit lines in the first direction, when viewed along a third direction that intersects the first and second directions, and to which a predetermined voltage is applied when a data read operation is performed on any of the memory cells.

11. The semiconductor memory device according to claim 10, wherein the plurality of memory blocks include
a plurality of transistors on a semiconductor substrate which are disposed at positions different from the memory blocks in the third direction,
a wiring layer that is provided on an opposite side of the plurality of transistors with respect to the plurality of memory blocks and includes the first wiring, and
a plurality of contacts that extend in the third direction and connects at least a part of the plurality of transistors provided on the semiconductor substrate and at least a part of wirings in the wiring layer.

12. The semiconductor memory device according to claim 11, wherein a width of the first wiring in the first direction is greater than a width of any of signal lines in the wiring layer in the first direction.

13. The semiconductor memory device according to claim 11, wherein a width of the first wiring in the first direction is greater than a distance between two bit lines adjacent in the second direction that are on either side of one of the plurality of contacts in the second direction.

14. The semiconductor memory device according to claim 13, wherein the plurality of memory blocks include a plurality of memory cell array regions arranged in the second direction and a plurality of contact regions that include the plurality of contacts, between the plurality of memory cell array regions, and the first wiring is not connected to any of the contacts.

15. The semiconductor memory device according to claim 13, wherein the plurality of memory blocks include a plurality of memory cell array regions arranged in the second direction and a plurality of contact regions that include the plurality of contacts, between the plurality of memory cell array regions, and the number of the contacts connected to the first wiring is less than the number of the contact regions arranged in the second direction.

16. The semiconductor memory device according to claim 10, wherein the first wiring includes a plurality of first portions that are arranged in the second direction and face an upper surface of the bit lines, and a plurality of second portions that interconnect two of the first portions and do not face the upper surface of the bit lines.

17. The semiconductor memory device according to claim 16, wherein a width in the first direction of the plurality of first portions is larger than a width in the first direction of the plurality of second portions.

18. The semiconductor memory device according to claim 17, wherein
first ends of the first portions in the first direction and first ends of the second portions in the first direction are not aligned along the second direction,
second ends of the first portions in the first direction and second ends of the second portions in the first direction are aligned along the second direction, and
one of the second portions is in direct contact with a contact that extends in the third direction and none of the first portions and the other second portions are in direct contact with a contact that extends in the third direction.

19. The semiconductor memory device according to claim 17, wherein
first ends of the first portions in the first direction and first ends of the second portions in the first direction are not aligned along the second direction,
second ends of the first portions in the first direction and second ends of the second portions in the first direction are not aligned along the second direction, and
one of the second portions is in direct contact with a contact that extends in the third direction and none of the first portions and the other second portions are in direct contact with a contact that extends in the third direction.

20. The semiconductor memory device according to claim 16, wherein
each of the second portion has a cutout along the first direction, and
one of the second portions is in direct contact with a contact that extends in the third direction and none of the first portions and the other second portions are in direct contact with a contact that extends in the third direction.

* * * * *